United States Patent
Park et al.

(10) Patent No.: US 8,809,844 B2
(45) Date of Patent: Aug. 19, 2014

(54) FOLDABLE THIN FILM TRANSISTOR

(75) Inventors: Jong-jin Park, Hwaseong-si (KR); Jung-kyun Im, Yongin-si (KR); Chwee Iin Choong, Yongin-si (KR); Un-yong Jeong, Seoul (KR); Min-kwan Shin, Seoul (KR)

(73) Assignees: Samsung Electronics Co., Ltd., Suwon-si (KR); Industry-Academic Cooperation Foundation, Yonsei University, Seoul (KR)

( * ) Notice: Subject to any disclaimer, the term of this patent is extended or adjusted under 35 U.S.C. 154(b) by 0 days.

(21) Appl. No.: 13/593,011

(22) Filed: Aug. 23, 2012

(65) Prior Publication Data

US 2013/0140531 A1 Jun. 6, 2013

(30) Foreign Application Priority Data

Dec. 5, 2011 (KR) .................. 10-2011-0129157

(51) Int. Cl.
*H01L 51/10* (2006.01)

(52) U.S. Cl.
USPC ................ 257/40; 257/4; 257/E51.003

(58) Field of Classification Search
USPC ............................. 257/40, E29.068
See application file for complete search history.

(56) References Cited

U.S. PATENT DOCUMENTS

| | | | |
|---|---|---|---|
| 2007/0120116 A1* | 5/2007 | Han | 257/40 |
| 2009/0200543 A1 | 8/2009 | Kerr et al. | |
| 2009/0283752 A1* | 11/2009 | Jiang et al. | 257/24 |
| 2009/0283755 A1* | 11/2009 | Jiang et al. | 257/24 |
| 2010/0033804 A1* | 2/2010 | Aoki | 359/296 |
| 2010/0051913 A1* | 3/2010 | Takeya et al. | 257/40 |
| 2010/0219409 A1* | 9/2010 | Ong et al. | 257/40 |
| 2010/0252802 A1* | 10/2010 | Numata et al. | 257/9 |
| 2011/0094675 A1* | 4/2011 | Sato et al. | 156/297 |

FOREIGN PATENT DOCUMENTS

| | | | |
|---|---|---|---|
| JP | 2003103553 | * | 4/2003 |
| JP | 2003103553 A | * | 4/2003 |
| JP | 2006-324467 A | | 11/2006 |
| JP | 2007-108241 A | | 4/2007 |
| JP | 2007108241 | * | 4/2007 |
| JP | 2007108241 A | * | 4/2007 |
| JP | 2010-50173 A | | 3/2010 |
| KR | 10-2011-0062382 A | | 6/2011 |
| KR | 10-2011-0068352 A | | 6/2011 |
| KR | 10-1043578 B1 | | 6/2011 |

OTHER PUBLICATIONS

Tae Gon Kim, Eun Hwan Jeong, Sang Chul Lim, Seong Hyun Kim, Gi Heon Kim, Seung Hyun Kim, Han-Yong Jeon, Ji Ho Youk, "PMMA-based Patternable Gate Insulators for Organic Thin-Film Transistors" Synthetic Metals, vol. 159 (2009), pp. 749-753.*

(Continued)

*Primary Examiner* — Tom Thomas
*Assistant Examiner* — John Bodnar
(74) *Attorney, Agent, or Firm* — Sughrue Mion, PLLC

(57) ABSTRACT

A foldable thin film transistor (TFT) is provided, the foldable TFT including: a foldable substrate; source and drain electrodes interconnected on the foldable substrate; a channel layer including nanofibers of an organic semiconductor connecting the source and drain electrodes; a gate electrode electronically connected with the source and drain electrodes and the channel layer; and a gate insulating layer disposed between the channel layer and the gate electrode and comprising an ionic liquid and a resin.

21 Claims, 4 Drawing Sheets

(56) References Cited

OTHER PUBLICATIONS

Kim et al. (Tae Gon Kim, Eun Hwan Jeong, Sang Chul Lim, Seong Hyun Kim, Gi Heon Kim, Seung Hyun Kim, Han-Yong Jeon, Ji Ho Youk, "PMMA-based Patternable Gate Insulators for Organic Thin-Film Transistors" Synthetic Metals, vol. 159 (2009).*

Ute Zschieschang; et al.; "Organic Electronics on Banknotes"; Advanced Materials, Materials Views; 2011; vol. 23; pp. 654-658, 10 sheets.

Daniel Tobjork et al; "Paper Electronics", Advanced Materials, Materials Views; 2011, vol. 23; pp. 1935-1961.

Dae-Hyeong Kim, et al; "Ultrathin Silicon Circuits With Strain-Isolation Layers and Mesh Layouts for High-Performance Electronics on Fabric, Vinyl, Leather, and Paper"; Advanced Materials, Wiley InterScience; 2009; vol. 21; pp. 3703-3707.

* cited by examiner

FOLDABLE THIN FILM TRANSISTOR

CROSS-REFERENCE TO RELATED APPLICATION

This application claims priority from Korean Patent Application No. 10-2011-0129157, filed on Dec. 5, 2011 in the Korean Intellectual Property Office, the disclosure of which is incorporated herein in its entirety by reference.

BACKGROUND

1. Field

The present disclosure relates to a thin film transistor (TFT) and a method of manufacturing the same, and more particularly, to a foldable TFT and a method of manufacturing the same.

2. Description of the Related Art

As the number of fields in which electronic devices are used increases, demand for flexible electronic devices which may overcome limitations of related art electronic devices formed on hard substrates are also increasing. Thin film transistors (TFTs) used in fields such as flexible displays, smart clothing, dielectric elastomer actuators (DEA), biocompatible electrodes, and electronic devices used to detect electric signals in a living body need to be flexible and foldable. In particular, in regard to manufacturing a foldable TFT, flexibility of each element forming the transistor is necessary.

SUMMARY

Aspects of one or more exemplary embodiments provide a thin film transistor (TFT) that is flexible and foldable.

Furthermore, aspects of one or more exemplary embodiments provide a method of manufacturing the TFT that is flexible and foldable.

Additional aspects will be set forth in part in the description which follows and, in part, will be apparent from the description, or may be learned by practice of exemplary embodiments.

According to an aspect of an exemplary embodiment, there is provided a foldable TFT including: a foldable substrate; source and drain electrodes separated from each other on the foldable substrate; a channel layer including organic semiconductor nanofibers connecting the source and drain electrodes; a gate electrode electronically insulated with the source and drain electrodes and the channel layer; and a gate insulating layer disposed between the channel layer and the gate electrode, and comprises an ionic liquid and a resin mixture.

The foldable substrate may be a paper substrate.

The paper substrate may include a capping layer on one or both surfaces of the paper substrate.

The foldable substrate may include a plastic substrate.

The plastic substrate may include a prepreg film interposed between plastic films.

The plastic substrate may include polyimide (PI) interposed between plastic films.

The plastic substrate may further include a polytetrafluoroethylene (PTFE) film.

The stacked plastic film may include a capping layer on one or both surfaces of the plastic substrate.

A cation of the ionic liquid may be one or more selected from the group consisting of a substituted or unsubstituted-imidazolium, pyrazolium, triazolium, thiazolium, oxazolium, pyridazinium, pyrimidinium, pyrazinium, ammonium, phosphonium, guanidinium, euronium, thioeuronium, pyridinium, and pyrrollium.

An anion of the ionic liquid may be one or more selected from the group consisting of halide anion, borate anion, phosphate anion, phosphinate anion, imide anion, sulfonate anion, acetated anion, sulfate anion, cyanate anion, thiocyanate anion, carbonate anion, and complex anion.

The resin may include at least one of an acrylic material, an epoxy material, or an elastomer material.

The gate electrode may be disposed on the source and drain electrodes.

The gate electrode may be disposed under the source and drain electrodes.

According to an aspect of another exemplary embodiment, there is provided a method of manufacturing a flexible TFT, the method including: disposing source and drain electrodes interconnected on a foldable substrate; disposing a channel layer formed of organic semiconductor nanofibers on the substrate for connecting the source electrode and the drain electrode; disposing a gate insulating layer formed of an ionic liquid and a resin mixture on the channel layer; and disposing a gate electrode on the gate insulating layer.

BRIEF DESCRIPTION OF THE DRAWINGS

These and/or other aspects will become apparent and more readily appreciated from the following description of exemplary embodiments, taken in conjunction with the accompanying drawings of which.

DETAILED DESCRIPTION OF EXEMPLARY EMBODIMENTS

Figure 1:
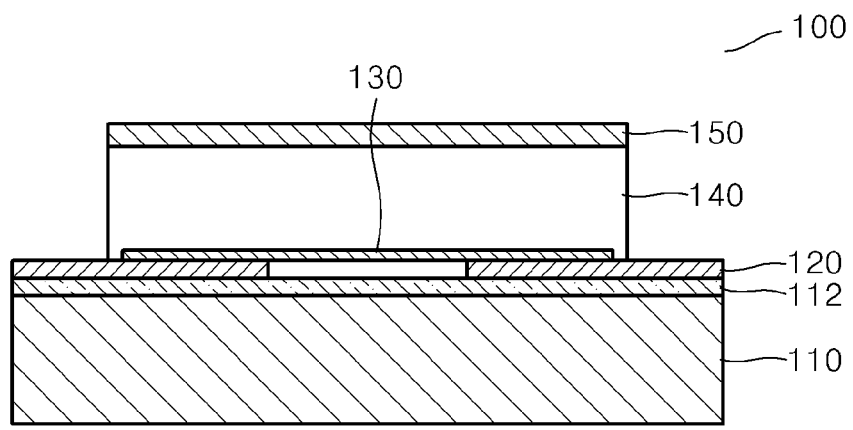
FIG. 1 is a schematic cross-sectional view of a flexible thin film transistor (TFT) according to an exemplary embodiment.

Reference will now be made in detail to a flexible thin film transistor (TFT) according to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, exemplary embodiments are merely described below, by referring to the figures, to explain aspects of the present description.

Hereinafter, a flexible TFT according to an exemplary embodiment will be described in detail.

FIG. 1 is a schematic cross-sectional view of a flexible TFT 100 according to an exemplary embodiment. Referring to FIG. 1, the flexible TFT 100 includes a substrate 110, source and drain electrodes 120, a channel layer 130, a gate insulating layer 140, and a gate electrode 150.

The substrate 110 may be formed of a foldable sheet of paper. The paper may be produced by loosening plant fibers in water, overlapping the fibers that are then matted together, and drying the result by removing the water. A sheet of paper with excellent smoothness, waterproofness, tensile strength, and foldability may be used for the substrate 110. For example, the sheet of paper of the substrate 110 may include natural fibers made of at least one of wood pulp, yam, ramie, hemp cloth, or wool; chemical fibers made of at least one of vinylon, nylon, acrylic, rayon, polypropylene, or asbestos fiber; or paper made of a mixture thereof, though it is understood that another exemplary embodiment is not limited thereto. The substrate 110 may have a thickness in a range of about 50 μm to about 1,000 μm.

The substrate 110 may further include a capping layer. For example, the substrate 110 may be formed of a sheet of paper and the capping layer (112) on a front, a back, or both sides of the sheet of paper. The capping layer (112) may provide the substrate 110 with mechanical strength, chemical stability, and planarity. For example, the capping layer (112) may be formed of a polymer film. The polymer film of the capping layer may be, for example, acryl, polyimide, bis-benzocyclobutene (BCB), or perfluorocyclobutane (PFCB), though it is understood that another exemplary embodiment is not limited thereto. The capping layer (112) may have a thickness in a range of about 1 μm to about 10 μm.

The source and drain electrodes 120 which are separated from each other are disposed on the substrate 110. The source and drain electrodes 120 may be formed of metal, metal oxide layer, or conductive polymer. The metal may include, for example, at least one of gold (Au), silver (Ag), chrome (Cr), titanium (Ti), copper (Cu), aluminum (Al), tantalum (Ta), molybdenum (Mo), tungsten (W), nickel (Ni), palladium (Pd), platinum (Pt), etc. The metal oxide layer may include, for example, indium tin oxide (ITO) or indium zinc oxide (IZO). The conductive polymer may be, for example, at least one of polyethylene dioxythiophene:polystyrene sulphonate (PEDOT:PSS), polyaniline, polypyrrole, etc.

The source and drain electrodes 120 may have a thickness in a range of about 10 nm to about 200 μm.

The channel layer 130 is disposed on the substrate 110 to connect a source electrode 120 and a drain electrode 120. The channel layer 130 may be formed of nanofibers of an organic semiconductor having a diameter of several nanometers to several micrometers. The channel layer according to an exemplary embodiment may be formed of a group of discontinuous nanofibers, as opposed to a continuous film.

The organic semiconductor of the channel layer 130 may be formed of, for example, at least one of polythiophene, polyacetylene, polypyrrole, polyphenylene, polythienyl vinylidene, polyphenylene sulfide, polyaniline, polyparaphenylene vinylene, polyparaphenylene, polyfluorene, polythiovinylene, etc.

Strands of nanofibers that are wave-shaped nanofibers parallel to one another may be used as the channel layer 130, though it is understood that a shape of the nanofibers of the channel layer 130 is not limited thereto. For example, the nanofibers of the channel layer 130 may have a web shape according to another exemplary embodiment. The channel layer 130 may be foldable since the channel layer 130 is formed of the organic semiconductor nanofibers.

The gate insulating layer 140 is disposed on the substrate 110 and the source and drain electrodes 120 on which the channel layer 130 is disposed. The gate insulating layer 140 may include a mixture of an ionic liquid and a resin. The ionic liquid may be a salt in a liquid state including a cation and an anion.

The cation of the ionic liquid of the gate insulating layer 140 may include at least one of imidazolium, pyrazolium, triazolium, thiazolium, oxazolium, pyridazinium, pyrimidinium, pyrazinium, ammonium, phosphonium, guanidinium, uronium, thiouronium, pyridinium, pyrroldinium, etc. One or more hydrogen atoms of the cation may be each independently substituted with a halogen atom, a carboxylic group, an amino group, a nitro group, a cyano group, a substituted or unsubstituted C1-C20 alkyl group, a substituted or unsubstituted C1-C20 alkoxy group, a substituted or unsubstituted C2-C20 alkenyl group, a substituted or unsubstituted C2-C20 alkynyl group, a substituted or unsubstituted C1-C20 heteroalkyl group, a substituted or unsubstituted C6-C30 aryl group, a substituted or unsubstituted C7-C30 arylakyl group, a substituted or unsubstituted C5-C30 heteroaryl group, or a substituted or unsubstituted C3-C30 heteroarylalkyl group.

The cation of the ionic liquid may be, for example, 1,3-dimethylimidazolium, 1-butyl-3-methylimidazolium, 1-ethyl-3-methylimidazolium, 1-hexadecyl-3-methylimidazolium, 1-hexyl-3-methylimidazolium, 3-methyl-1-octadecylimidazolium, 3-methyl-1-octylimidazolium, 3-methyl-tetradecylimidazolium, 1-butyl-2,3-dimethylimidazolium, 1-ethyl-2,3-dimethylimidazolium, 1-hexadecyl-2,3-dimethylimidazolium, 1-hexyl-2,3-dimethylimidazolium, 1,2,3-trimethylimidazolium, N-hexylpyridinium, N-butyl-3,4-dimethylpyridinium, N-butyl-3,5-dimethylpyridinium, N-butyl-3-methylpyridinium, N-butyl-4-methylpyridinium, N-butylpyridinium, N-ethylpyridinium, N-hexylpyridinium, N-octylpyridinium; 1,1-dimethylpyrroldinium, 1-butyl-1-methylpyrroldinium, 1-hexyl-1-methylpyrroldinium, 1-methyl-1-octylpyrroldinium, trihexyl(tetradecyl)phosphonium, methyltrioctylammonium, ethyl-dimethyl-propylammonium, guanidinium, N"-ethyl-N,N,N',N'-tetramethylguanidinium, O-ethyl-N,N,N',N'-tetramethylisouronium, or S-ethyl-N,N,N',N'-tetramethylisothiouronium.

The anion of the ionic liquid may be halide, borate anion, phosphate anion, phosphinate anion, imide anion, sulfonate anion, acetate anion, sulfate anion, cyanate anion, thiocyanate anion, carbonate anion, complex anion, or ClO4-.

The anion of the ionic liquid may be, for example, PF6-, BF4-, B(C2O4)-, CH3(C6H5)SO3-, (CF3CF2)2PO2-, CF3SO3-, CF3SO4-, CH3(CH2)7SO4-, N(CF3SO2)2-, N(C2F5SO2)2-, C(CF3SO2)3-, AsF6-, SbF6-, AlCl4-, NbF6-, HSO4-, ClO4-, CH3SO3-, or CF3CO2-.

The ionic liquid may be, for example, 1,3-dimethylimidazolium trifluoromethane sulfonate, 1-butyl-3-methylimidazolium bromide, 1-butyl-3-methylimidazolium chloride, 1-butyl-3-methylimidazolium hexafluorophosphate, 1-butyl-3-methylimidazolium hexafluorophosphate, 1-butyl-3-methylimidazolium iodide, 1-butyl-3-methylimidazolium methylsulfate, 1-butyl-3-methylimidazolium octylsulfate, 1-butyl-3-methylimidazolium tetrafluoroborate, 1-butyl-3-methylimidazolium trifluorometal sulfonate, 1-butyl-3-methylimidazolium trifluoroacetate, 1-ethyl-3-methylimidazolium bis[oxalato]borate, 1-ethyl-3-methylimidazolium bromide, 1-ethyl-3-methylimidazolium chloride, 1-ethyl-3-methylimidazolium hexafluorophosphate, 1-ethyl-3-methylimidazolium methylsulfate, 1-ethyl-3-methylimidazolium p-toluenesulfonate, 1-ethyl-3-methylimidazolium tetrafluoroborate, 1-ethyl-3-methylimidazolium thiocyanate, 1-ethyl-3-methylimidazolium trifluoromethane sulfonate, 1-ethyl-3-methylimidazolium trifluoroacetate, 1-ethyl-3-methylimidazolium bis(pentafluoroethyl)phosphinate, 1-hexadecyl-3-methylimidazolium chloride, 1-hexyl-3-methylimidazolium bis(trifluoromethylsulfonyl)imide, 1-hexyl-3-methylimidazolium chloride, 1-hexyl-3-methylimidazolium hexafluorophosphate, 1-hexyl-3-methylimidazolium tetrafluoroborate, 1-hexyl-3-methylimidazolium tri(pentafluoroethyl)trifluorophosphate, 3-methyl-1-octadecylimidazolium bis(trifluorosulfonyl)imide, 3-methyl-1-octadecylimidazolium hexafluorophosphate, 3-methyl-1-octadecylimidazolium tri(pentafluoroethyl)trifluorophosphate, 3-methyl-1-octylimidazolium bis(trifluoromethylsulfonyl)imide, 3-methyl-1-octylimidazolium chloride, 3-methyl-1-octylimidazolium hexafluorophosphate, 3-methyl-1-octylimidazolium octylsulfate, 3-methyl-1-octylimidazolium tetrafluoroborate, 3-methyl-1-tetradecylimidazolium tetrafluoroborate, 1-propyl-3-methylimidazolium iodide; 1-butyl-2,3-dimethylimidazolium chloride, 1-butyl-2,3-dimethylimidazolium hexafluorophosphate, 1-butyl-2,3-dimethylimidazolium iodide, 1-butyl-2,3-dimethylimidazolium octylsulfate, 1-butyl-2,3-dimethylimidazolium tetrafluoroborate, 1-ethyl-2,3-dimethylimidazolium bromide, 1-ethyl-2,3-dimethylimidazolium chloride, 1-ethyl-2,3-dimethylimidazolium hexafluorophosphate, 1-ethyl-2,3-dimethylimidazolium p-toluenesulfonate, 1-ethyl-2,3-dimethylimidazolium tetrafluoroborate, 1-hexadecyl-2,3-dimethylimidazolium chloride, 1-hexyl-2,3-dimethylimidazolium chloride, 1,2,3-trimethylimidazolium iodide; N-hexylpyridinium bis(trifluoromethylsulfonyl)imide, N-butyl-3,4-dimethylpyridinium chloride, N-butyl-3,5-dimethylpyridinium chloride, N-butyl-3-methylpyridinium chloride, N-butyl-4-methylpyridinium bromide, N-butyl-4-methylpyridinium chloride, N-butyl-4-methylpyridinium hexafluorophosphate, N-butyl-4-methylpyridinium tetrafluoroborate, N-butylpyridinium chloride, N-butylpyridinium hexafluorophosphate, N-butylpyridinium trifluoromethane sulfonate, N-ethylpyridinium bromide, N-ethylpyridinium chloride, N-hexylpyridinium hexafluorophosphate, N-hexylpyridinium tetrafluoroborate, N-hexylpyridinium trifluorometal sulfonate, N-octylpyridinium chloride; 1,1-dimethylpyrroldinium iodide, 1-butyl-1-methylpyrroldinium bis(trifluoromethylsulfonyl)imide, 1-butyl-1-methylpyrroldinium chloride, 1-butyl-1-methylpyrroldinium hexafluorophosphate, 1-butyl-1-methylpyrroldinium tetrafluoroborate, 1-butyl-1-methylpyrroldinium trifluoroacetate, 1-butyl-1-methylpyrroldinium trifluorometal sulfonate, 1-butyl-1-methylpyrroldinium tri(pentafluoroethyl)trifluorophosphate, 1-butyl-1-methylpyrroldinium bis[oxalato(2-)]borate, 1-hexyl-1-methylpyrroldinium chloride, 1-methyl-1-octylpyrroldinium chloride; trihexyl(tetradecyl)phosphonium bis(trifluoromethylsulfonyl)imide, trihexyl(tetradecyl)phosphonium bis[oxalato(2-)]borate, trihexyl(tetradecyl)phosphonium chloride, trihexyl(tetradecyl)phosphonium hexafluorophosphate, trihexyl(tetradecyl)phosphonium tetrafluoroborate, trihexyl(tetradecyl)phosphonium tri(pentafluoroethyl)trifluorophosphate, 1-hexyl-3-methylimidazoliumtris(pentafluoride ethyl)trifluorophosphate, 1-butyl-3-methylimidazoliumtris(pentafluoride ethyl)trifluorophosphate, 1-butyl-3-methylimidazoliumhexafluorophosphate; methyltrioctylammonium bis(trifluoromethylsulfonyl)imide, methyltrioctylammonium trifluoroacetate, methyltrioctylammonium trifluorometal sulfonate, ethyl-dimethyl-propylammonium bis(trifluoromethylsulfonyl)imide; guanidinium trifluorometal sulfonate, guanidinium tri(pentafluoroethyl)trifluorophosphate, N"-ethyl-N,N,N',N'-tetramethylguanidinium trifluorometal sulfonate, N"-ethyl-N,N,N',N'-tetramethylguanidinium tri(pentafluoroethyl)trifluorophosphate; O-ethyl-N,N,N',N'-tetramethylisouronium trifluorometal sulfonate, O-ethyl-N,N,N',N'-tetramethylisouronium tri(pentafluoroethyl)trifluorophosphate, S-ethyl-N,N,N',N'-tetramethylisothiouronium trifluorometal sulfonate, S-ethyl-N,N,N',N'-tetramethylisouronium, or tri(pentafluoroethyl)trifluorophosphate.

The resin may be an ultraviolet (UV)-curable acrylic resin, a thermal-curable epoxy resin, or an elastomer resin composition. For example, the resin may include poly(ethylene glycol) diacrylate, trimethylolpropane triacrylate, or dipentaerythritol hexa acrylate. The resin blended with the ionic liquid may be cured to form a gate insulating layer that has flexibility.

A content of the ionic liquid of the gate insulating layer 140 may be about 0.001 to about 20 weight percentage. The ionic liquid in the gate insulating layer 140 may be dielectric. The resin mixed with the ionic liquid has a dielectric property, flexibility, and an excellent adhesion to a substrate. The gate insulating layer 140 may have a thickness in a range of about 10 nm to about 500 nm. The gate insulating layer 140 may include an ionic liquid and a resin, and thus is foldable.

The gate electrode 150 is disposed on the gate insulating layer 140. The gate electrode 150 may include metal, a metal oxide layer, or a conductive polymer. The metal may include, for example, at least one of Au, Ag, Cr, Ti, Cu, Al, Ta, Mo, W, Ni, Pd, Pt, etc. The metal oxide layer may include, for example, ITO or IZO. The conductive polymer may be, for example, PEDOT:PSS, polyaniline, polypyrrole, or a mixture thereof.

The gate electrode 150 may have a thickness in a range of about 10 nm to about 200 μm.

Hereinafter, a flexible TFT according to another exemplary embodiment will be described in detail.

Figure 2:
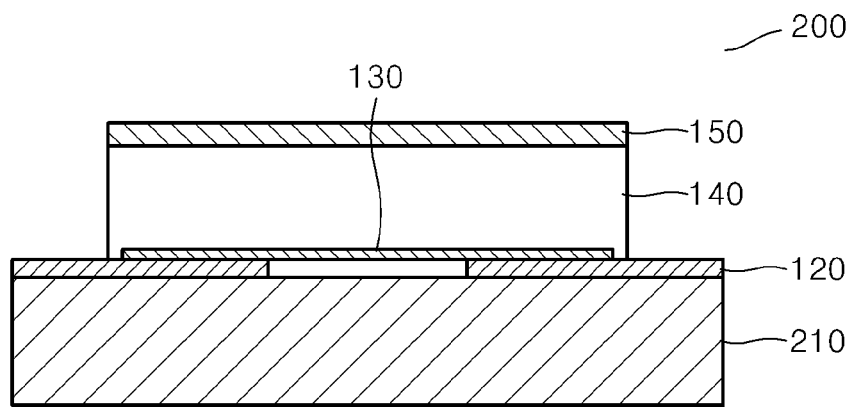
FIG. 2 is a schematic cross-sectional view of a flexible TFT according to another exemplary embodiment.

FIG. 2 is a schematic cross-sectional view of a flexible TFT 200 according to another exemplary embodiment. Referring to FIG. 2, the flexible TFT 200 includes a substrate 210, source and drain electrodes 120, a channel layer 130, a gate insulating layer 140, and a gate electrode 150.

The flexible TFT 200 according to the present exemplary embodiment is different from the exemplary embodiment described with reference to FIG. 1 in that the substrate 210 formed of foldable plastic is used instead of the substrate 110 made of paper. The substrate 210 may be formed of a stacked plastic film.

Figure 3A:
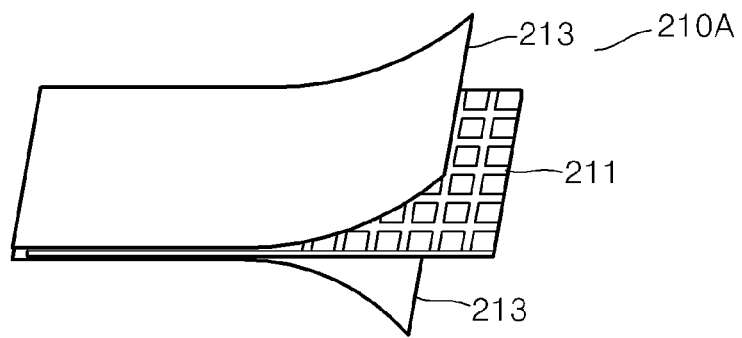
FIG. 3A is a schematic diagram illustrating a plastic substrate according to an exemplary embodiment.

FIG. 3A is a schematic diagram of a plastic substrate 210A according to an exemplary embodiment. Referring to FIG. 3A, the plastic substrate 210A includes a middle layer 211 and a first outer layer 213 on opposite faces of the middle layer 211.

The middle layer 211 may be a prepreg film which includes reinforced fibers impregnated with resin. The resin may include at least one of polyester resin, acrylate resin, etc. The reinforced fibers may include, for example, glass fibers, silica fibers, or the like.

The first outer layer 213 may be a film of, for example, polyphenylene oxide, polyethylene terephthalate, polybutylene terephthalate, polydihydroxymethylcyclohexyl terephthalate, cellulose esters, polycarbonate, polyamide, or polyimide.

The middle layer 211 including the prepreg film inside the plastic substrate 210A may increase a mechanical strength of the plastic substrate 210A, and the first outer layer 213 may provide adhesive and hydrophobic properties in the plastic substrate 210A.

Figure 3B:
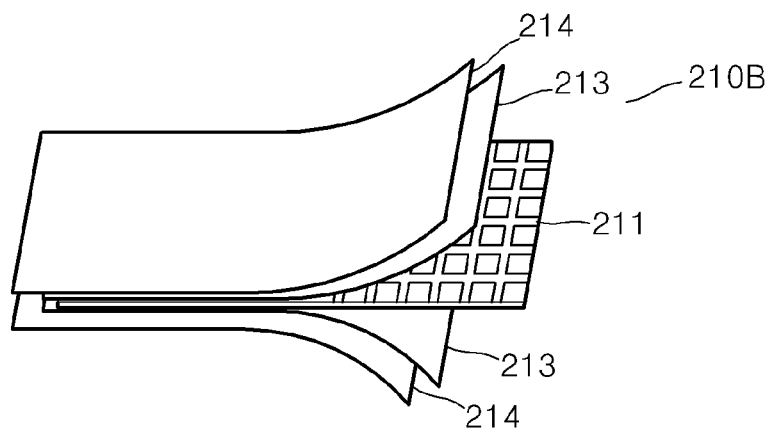
FIG. 3B is a schematic diagram illustrating a plastic substrate according to another exemplary embodiment.

FIG. 3B is a schematic diagram of a plastic substrate 210B according to another exemplary embodiment. Referring to FIG. 3B, the plastic substrate 210B may be formed of a middle layer 211, a first outer layer 213 on opposite faces of the middle layer 211, and a second outer layer 214 on the first outer layer 213.

The middle layer 211 and the first outer layer 213 are the same as or similar to the plastic substrate 210A described with reference to FIG. 3A.

The second outer layer 214 may include a hydrophobic film, such as polytetrafluoroethylene (PTFE). The second outer layer 214 may serve to prevent water penetration while maintaining flexibility.

Figure 3C:
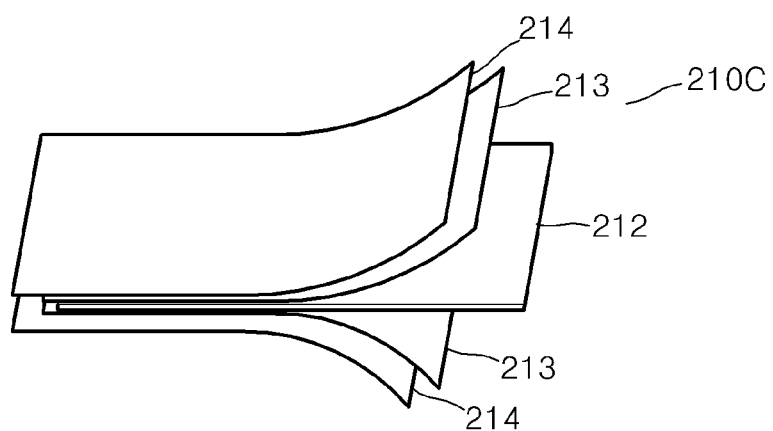
FIG. 3C is a schematic diagram illustrating a plastic substrate according to another exemplary embodiment.

FIG. 3C is a schematic diagram of a plastic substrate 210C according to another exemplary embodiment. Referring to FIG. 3C, the plastic substrate 210C may include a middle layer 212, a first outer layer 213 on opposite faces of the middle layer 212, and a second outer layer 214 on the first outer layer 213.

The middle layer 212 may be, for example, a polyimide film or polyethlylene naphthalate (PEN). The first outer layer 213 may be a film of, for example, polyphenylene oxide, polyethylene terephthalate, polybutylene terephthalate, polydihydroxymethylcyclohexyl terephthalate, cellulose esters, polycarbonate, or polyamide.

The second outer layer 214 may include a hydrophobic film, such as PTFE or another hydrophobic film.

Optionally, the substrates 210A, 210B, and 210C including plastic may further include a capping layer (not shown) on the outermost surface. The capping layer (not shown) may further provide a planarization property and a barrier property with respect to water. The capping layer (not shown) may include, for example, SIO2, SiON, SiN, fluorinated silica glass (FSG), hydrogensilsesquioxane (HSQ), methylsilsesquioxane (MSQ), bis-benzocyclobutene (BCB), poly arylene ether (PAE), or hybrid-organo-siloxane poymer (HOSP).

The TFT may be freely folded or bended since elements of the TFT according to the above-described exemplary embodiments include a foldable material or configuration.

Hereinafter, a method for producing a flexible TFT according to an exemplary embodiment will be described in detail.

FIGS. 4A through 4D are schematic cross-sectional views to describe a method of manufacturing a flexible TFT according to an exemplary embodiment in a sequential process.

Figure 4A:
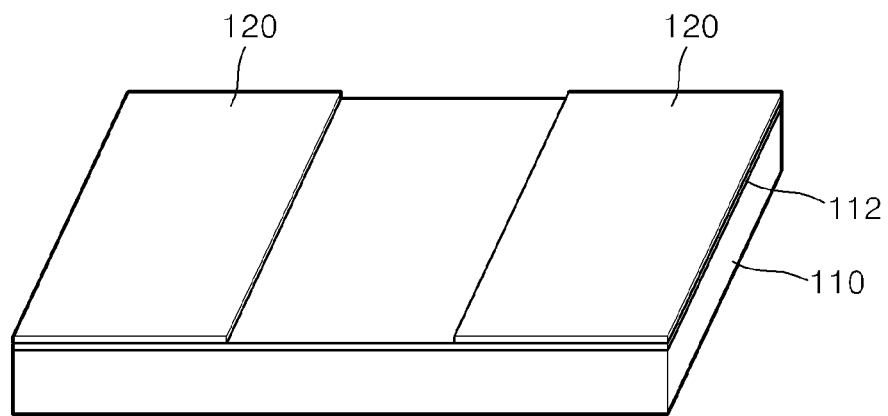
FIGS. 4A through 4D are schematic cross-sectional views to describe a method of manufacturing the flexible TFT in a sequential process according to an exemplary embodiment.

Referring to FIG. 4A, source and drain electrodes 120 are provided (e.g., formed) on a substrate 110.

For the substrate 110, a sheet of paper with excellent smoothness, waterproofness, tensile strength, and foldability may be used. The sheet of paper of the substrate 110 may include, for example, natural fibers made of at least one of wood pulp, yam, ramie, hemp cloth, or wool; chemical fibers made of at least one of vinylon, nylon, acrylic, rayon, polypropylene, or asbestos fiber; or paper made of a mixture thereof, though it is understood that one or more other exemplary embodiments are not limited thereto. The substrate 110 may have a thickness of about 50 μm to about 1,000 μm.

The substrate 110 may use a sheet of paper including the capping layer (212) on a front, a back, or both faces of the substrate 110 to provide more mechanical strength, chemical stability, and flatness. The capping layer (212) may include, for example, a polymer film coated or laminated on the sheet of paper.

The polymer film of the capping layer (212) may include, for example, acryl, polyimide, BCB, or PFCB, though it is understood that another exemplary embodiment is not limited thereto. The capping layer may have a thickness in a range of about 1 μm to about 10 μm.

Alternatively, a plastic substrate may be used for the substrate 110. The plastic substrate may include a stacked film. The plastic substrate may use any of the plastic substrates 210A, 210B, and 210C described with reference to FIGS. 3A through 3C.

When the substrates 210A, 210B, and 210C include the capping layer (212), the capping layer (212) may be provided by using a method of, for example, spin coating, spray coating, deep coating, role coating, or chemical vapor deposition (CVD).

The source and drain electrodes 120 may include metal, a metal oxide layer, or a conductive polymer. The metal may include, for example, at least one of Au, Ag, Cr, Ti, Cu, Al, Ta, Mo, W, Ni, Pd, Pt, etc. The metal oxide layer may include ITO, IZO, etc. The conductive polymer may include at least one of PEDOT:PSS, polyaniline, polypyrrole, etc.

The metal material may be provided by using a method of, for example, sputtering or thermal evaporation, the metal oxide layer may be provided by using a method of, for example, metal organic chemical vapor deposition (MOCVD), and the conductive polymer may be provided by using, for example, an inkjet process. The source and drain electrodes 120 may have a thickness in a range of about 10 nm to about 200 μm.

Figure 4B:
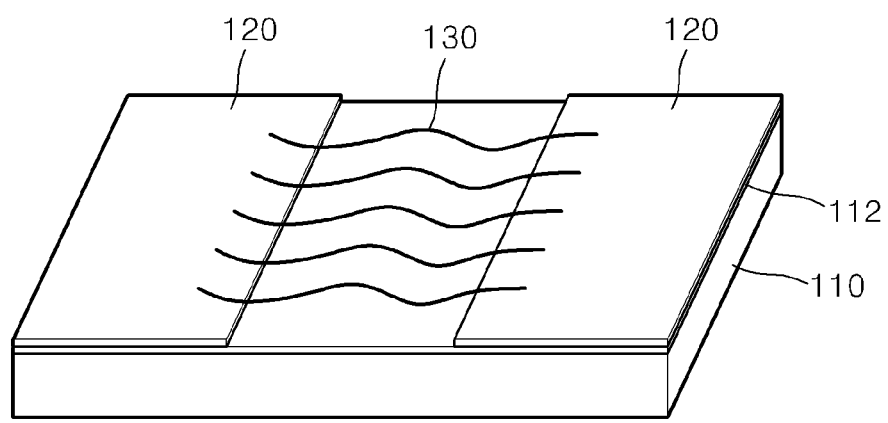

Referring to FIG. 4B, the channel layer 130 is provided on the substrate 110 to connect the source electrode 120 and the drain electrode 120.

The channel layer 130 may include organic semiconductor nanofibers by using, for example, an electrospinning process. For the organic semiconductor, polythiophene, polyacetylene, polypyrrole, polyphenylene, polythienyl vinylidene, polyphenylene sulfide, polyaniline, polyparaphenylene vinylene, polyparaphenylene, polyfluorene, or polythiovinylene may be used. By controlling the electrospinning conditions, a shape of the nanofibers of the channel layer 130 may be adjusted. The channel layer 130 may include strands of the nanofibers that are wave-shaped nanofibers parallel to one another, but the shape of the nanofibers of the channel layer 130 is not limited thereto. For example, the channel layer 130 may include web-shaped nanofibers. The channel layer 130 may have a diameter in a range of, for example, about 10 nm to about 100 μm.

Figure 4C:
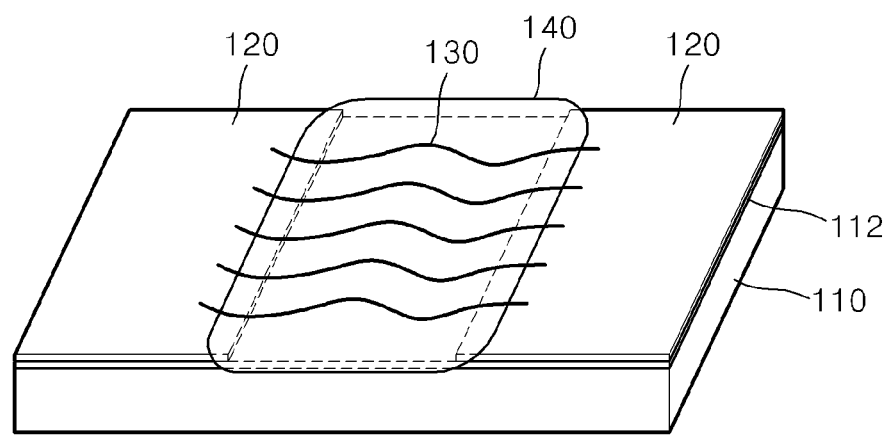

Referring to FIG. 4C, the gate insulating layer 140 is provided on the substrate 110 and the source and drain electrodes 120 on which the channel layer is disposed. The gate insulating layer 140 may be provided by mixing ionic liquid and resin.

Cations of the ionic liquid of the gate insulating layer 140 may include at least one of imidazolium, pyrazolium, triazolium, thiazolium, oxazolium, pyridazinium, pyrimidinium, pyrazinium, ammonium, phosphonium, guanidinium, uronium, thiouronium, pyridinium, pyrroldinium, etc. One or more hydrogen atoms of the cation may be each independently substituted with a halogen atom, a carboxylic group, an amino group, a nitro group, a cyano group, a substituted or unsubstituted C1-C20 alkyl group, a substituted or unsubstituted C1-C20 alkoxy group, a substituted or unsubstituted C2-C20 alkenyl group, a substituted or unsubstituted C2-C20 alkynyl group, a substituted or unsubstituted C1-C20 heteroakyl group, a substituted or unsubstituted C6-C30 aryl group, a substituted or unsubstituted C7-C30 arylakyl group, a substituted or unsubstituted C5-C30 heteroaryl group, or a substituted or unsubstituted C3-C30 heteroarylalkyl group.

The cation of the ionic liquid may be, for example, 1,3-dimethylimidazolium, 1-butyl-3-methylimidazolium, 1-ethyl-3-methylimidazolium, 1-hexadecyl-3-methylimidazolium, 1-hexyl-3-methylimidazolium, 3-methyl-1-octadecylimidazolium, 3-methyl-1-octylimidazolium, 3-methyl -tetradecylimidazolium, 1-butyl-2,3-dimethylimidazolium, 1-ethyl-2,3-dimethylimidazolium, 1-hexadecyl-2,3-dimethylimidazolium, 1-hexyl-2,3-dimethylimidazolium, 1,2,3-trimethylimidazolium, N-hexylpyridinium, N-butyl-3, 4-dimethylpyridinium, N-butyl-3,5-dimethylpyridinium, N-butyl-3-methylpyridinium, N-butyl-4-methylpyridinium, N-butylpyridinium, N-ethylpyridinium, N-hexylpyridinium, N-octylpyridinium; 1,1-dimethylpyrroldinium, 1-butyl-1-methylpyrroldinium, 1-hexyl-1-methylpyrroldinium, 1-methyl-1-octylpyrroldinium, trihexyl(tetradecyl)phosphonium, methyltrioctylammonium, ethyl -dimethyl-propylammonium, guanidinium, N''-ethyl-N,N,N',N'-tetramethylguanidinium, O-ethyl-N,N,N',N'-tetramethylisouronium, or S-ethyl-N,N,N',N'-tetramethylisothiouronium.

The anion of the ionic liquid may be a halide, a borate anion, a phosphate anion, a phosphinate anion, an imide anion, a sulfonate anion, an acetated anion, a sulfate anion, a cyanate anion, a thiocyanate anion, a carbonate anion, a complex anion, or ClO4-.

The anion of the ionic liquid may be, for example, PF6-, BF4-, B(C2O4)-, CH3(C6H5)SO3-, (CF3CF2)2PO2-, CF3SO3-, CF3SO4-, CH3(CH2)7SO4-, N(CF3SO2)2-, N(C2F5SO2)2-, C(CF3SO2)3-, AsF6-, SbF6-, AlCl4-, NbF6-, HSO4-, ClO4-, CH3SO3-, or CF3CO2-.

The ionic liquid may be, for example, 1,3-dimethylimidazolium trifluoromethane sulfonate, 1-butyl-3-methylimidazolium bromide, 1-butyl-3-methylimidazolium chloride, 1-butyl-3-methylimidazolium hexafluorophosphate, 1-butyl-3-methylimidazolium hexafluorophosphate, 1-butyl-3-methylimidazolium iodide, 1-butyl-3-methylimidazolium methylsulfate, 1-butyl-3-methylimidazolium octylsulfate, 1-butyl-3-methylimidazolium tetrafluoroborate, 1-butyl-3-methylimidazolium trifluorometal sulfonate, 1-butyl-3-methylimidazolium trifluoroacetate, 1-ethyl-3-methylimidazolium bis[oxalato]borate, 1-ethyl-3-methylimidazolium bromide, 1-ethyl-3-methylimidazolium chloride, 1-ethyl-3-methylimidazolium hexafluorophosphate, 1-ethyl-3-methylimidazolium methylsulfate, 1-ethyl-3-methylimidazolium p -toluenesulfonate, 1-ethyl-3-methylimidazolium tetrafluoroborate, 1-ethyl-3-methylimidazolium thiocyanate, 1-ethyl-3-methylimidazolium trifluoromethane sulfonate, 1-ethyl-3-methylimidazolium trifluoroacetate, 1-ethyl-3-methylimidazolium bis(pentafluoroethyl)phosphinate, 1-hexadecyl-3-methylimidazolium chloride, 1-hexyl-3-methylimidazolium bis(trifluoromethylsulfonyl)imide, 1-hexyl-3-methylimidazolium chloride, 1-hexyl-3-methylimidazolium hexafluorophosphate, 1-hexyl-3-methylimidazolium tetrafluoroborate, 1-hexyl-3-methylimidazolium tri(pentafluoroethyl)trifluorophosphate, 3-methyl-1-octadecylimidazolium bis(trifluorosulfonyl)imide, 3-methyl-1-octadecylimidazolium hexafluorophosphate, 3-methyl-1-octadecylimidazolium tri(pentafluoroethyl)trifluorophosphate, 3-methyl-1-octylimidazolium bis(trifluoromethylsulfonyl)imide, 3-methyl-1-octylimidazolium chloride, 3-methyl-1-octylimidazolium hexafluorophosphate, 3-methyl-1-octylimidazolium octylsulfate, 3-methyl-1-octylimidazolium tetrafluoroborate, 3-methyl-1-tetradecylimidazolium tetrafluoroborate, 1-propyl-3-methylimidazolium iodide; 1-butyl-2,3-dimethylimidazolium chloride, 1-butyl-2,3-dimethylimidazolium hexafluorophosphate, 1-butyl-2,3-dimethylimidazolium iodide, 1-butyl-2,3-dimethylimidazolium octylsulfate, 1-butyl-2,3-dimethylimidazolium tetrafluoroborate, 1-ethyl-2,3-dimethylimidazolium bromide, 1-ethyl-2,3-dimethylimidazolium chloride, 1-ethyl-2,3-dimethylimidazolium hexafluorophosphate, 1-ethyl-2,3-dimethylimidazolium p-toluenesulfonate, 1-ethyl-2,3-dimethylimidazolium tetrafluoroborate, 1-hexadecyl-2,3-dimethylimidazolium chloride, 1-hexyl-2,3-dimethylimidazolium chloride, 1,2,3-trimethylimidazolium iodide; N-hexylpyridinium bis(trifluoromethylsulfonyl)imide, N-butyl-3,4-dimethylpyridinium chloride, N-butyl-3,5-dimethylpyridinium chloride, N-butyl-3-methylpyridinium chloride, N-butyl-4-methylpyridinium bromide, N-butyl-4-methylpyridinium chloride, N-butyl-4-methylpyridinium hexafluorophosphate, N-butyl-4-methylpyridinium tetrafluoroborate, N-butylpyridinium chloride, N-butylpyridinium hexafluorophosphate, N-butylpyridinium trifluoromethane sulfonate, N-ethylpyridinium bromide, N-ethylpyridinium chloride, N-hexylpyridinium hexafluorophosphate, N-hexylpyridinium tetrafluoroborate, N-hexylpyridinium trifluorometal sulfonate, N-octylpyridinium chloride; 1,1-dimethylpyrroldinium iodide, 1-butyl-1-methylpyrroldinium bis(trifluoromethylsulfonyl)imide, 1-butyl-1-methylpyrroldinium chloride, 1-butyl-1-methylpyrroldinium hexafluorophosphate, 1-butyl-1-methylpyrroldinium tetrafluoroborate, 1-butyl-1-methylpyrroldinium trifluoroacetate, 1-butyl-1-methylpyrroldinium trifluorometal sulfonate, 1-butyl-1-methylpyrroldinium tri(pentafluoroethyl)trifluorophosphate, 1-butyl-1-methylpyrroldinium bis[oxalato(2-)]borate, 1-hexyl-1-methylpyrroldinium chloride, 1-methyl-1-octylpyrroldinium chloride; trihexyl(tetradecyl)phosphonium bis(trifluoromethylsulfonyl)imide, trihexyl(tetradecyl)phosphonium bis[oxalato(2-)]borate, trihexyl(tetradecyl)phosphonium chloride, trihexyl(tetradecyl)phosphonium hexafluorophosphate, trihexyl(tetradecyl) phosphonium tetrafluoroborate, trihexyl(tetradecyl)phosphonium tri(pentafluoroethyl)trifluorophosphate, 1-hexyl-3-methylimidazoliumtris(pentafluoride ethyl) trifluorophosphate, 1-butyl-3-methylimidazoliumtris(pentafluoride ethyl)trifluorophosphate, 1-butyl-3-methylimidazoliumhexafluorophosphate; methyltrioctylammonium bis(trifluoromethylsulfonyl)imide, methyltrioctylammonium trifluoroacetate, methyltrioctylammonium trifluorometal sulfonate, ethyl-dimethyl-propylammonium bis(trifluoromethylsulfonyl)imide; guanidinium trifluorometal sulfonate, guanidinium tri(pentafluoroethyl)trifluorophosphate, N''-ethyl-N,N,N',N'-tetramethylguanidinium trifluorometal sulfonate, N''-ethyl-N,N,N',N'-tetramethylguanidinium tri(pentafluoroethyl)trifluorophosphate; O-ethyl-N,N,N',N'-tetramethylisouronium trifluorometal sulfonate, O-ethyl-N,N,N',N'-tetramethylisouronium tri(pentafluoroethyl)trifluorophosphate, S-ethyl-N,N,N',N'-tetramethylisothiouronium trifluorometal sulfonate, S-ethyl-N,N,N',N'-tetramethylisouronium, or tri(pentafluoroethyl) trifluorophosphate.

For the resin, a UV-curable acrylic resin, a thermal-curable epoxy resin, or an elastomer resin composition may be used. The resin blended with the ionic liquid may be cured to form a gate insulating layer that has flexibility.

A content of the ionic liquid of the gate insulating layer 140 may be about 0.001 to about 20 weight percentage. The gate insulating layer 140 may have a thickness in a range of about 10 nm to about 200 μm.

Figure 4D:
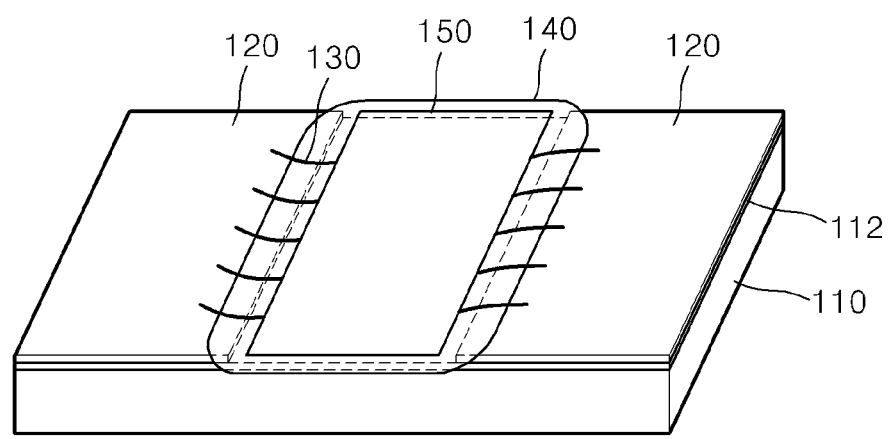

Referring to FIG. 4D, the gate electrode 150 is provided on the gate insulating layer 140. The gate electrode 150 may inlcude metal, a metal oxide layer, or a conductive polymer. The metal may include, for example, at least one of Au, Ag, Cr, Ti, Cu, Al, Ta, Mo, W, Ni, Pd, Pt, etc. The metal oxide layer may include, for example, ITO, IZO, etc. The conductive polymer may include, for example, at least one of PEDOT: PSS, polyaniline, polypyrrole, etc.

The metal material may be provided by using a method of, for example, sputtering or thermal evaporation, the metal oxide layer may be provided by using a method of, for example, MOCVD, and the conductive polymer may be provided by using, for example, an inkjet process. The gate electrode 150 may have a thickness in a range of about 10 nm to about 200 µm.

The foldable TFT sequentially stacked with source and drain electrodes, a channel layer, a gate insulating layer, and a gate electrode is described above, but the order of the source and drain electrodes, the channel layer, the gate insulating layer, and the gate electrode stack is not limited thereto and may vary in one or more other exemplary embodiments. For example, the foldable TFT may be sequentially stacked with a gate electrode, a gate insulating layer, a channel layer, and source and drain electrodes according to another exemplary embodiment.

EXAMPLE 1

Formation of Transistor

In the present example, a 1,000 won bill issued by the Bank of Korea washed with ethanol was used as a substrate. A source electrode and a drain electrode were formed to a thickness of about 100 nm with gold (Au) by using thermal evaporation on the bill substrate. Then, a nanofiber channel layer of poly-3(hexylthiophene) (P3HT) was formed on the bill substrate by using electrospinning. More specifically, P3HT (molecular weight ~87,000, 95% regioregularity, Sigma-Aldrich) and polycaprolactone (PCL) (molecular weight ~80,000, Sigma-Aldrich) were mixed in a weight ratio of 7:3. The mixture was dissolved in chloroform so that a total weight of the mixture in the solution was about 12 weight percentage. The chloroform solution dissolved with the P3HT and PCL mixture was used as a solution for electrospinning. Nanofibers of P3HT were manufactured in conditions using the solution for electrospinning, applied voltage 18 kV, solution-releasing rate 0.2 ml/hr, and a distance of 10 cm between a nozzle tip and a collector.

The nanofibers of P3HT were formed to electrically connect the source electrode and the drain electrode. The electrospun nanofibers of P3HT were heat treated at a temperature of 100° C. for 2 hours.

Subsequently, a gate insulating layer of ionic liquid was formed on the bill substrate. For this, a mixture of a PEG-DA monomer, which is a photo-curable resin, 1-ethyl-3-methylimidazolium bis(trifluoromethylsulfonyl)imide ([EMIM][TFSI]) (Merk) ionic liquid, and a photohardening agent of 2-hydroxy-2-methylpropiophenone (HOMPP) (Sigma Adrich) (90:7:3) (w/w) was uniformly dropped on the bill substrate. Next, mask patterns were formed on the bill substrate where the ionic liquid mixture was dropped, and a portion where a gate insulating layer was to be formed was exposed and irradiated with UV for about 2 seconds. After irradiating UV, any remaining ionic liquid and the nanofibers of P2HT on the bill substrate were removed by using chloroform.

Then, a PEDOP:PSS gate electrode was formed on the gate insulating layer. For this, PEDOT:PSS (AI 4083, HC STARCK) was spin coated (2,000 rpm, 30 seconds) on a slide glass. The slide glass spin coated with PEDOT:PSS was stamped on the gate insulating layer and was heat treated at a temperature of about 60° C. for about 30 minutes, and thus transferred a PEDOT:PSS layer onto the gate insulating layer.

ID-VG characteristics were maintained at a measurement after repeating 300 times a bending test performed on the TFT of Example 1. Also, charge mobility and values of a drain current and threshold voltage measured after repeating 100 times the bending test performed on the TFT of Example 1 were maintained.

As described above, according to one or more exemplary embodiments, a TFT that is foldable by using a paper substrate or a plastic substrate, using a channel layer including nanofibers, and using a gate insulating layer including a resin including an ionic liquid and capable of maintaining fine device characteristics even after repeated folding, is provided.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

What is claimed is:

1. A foldable thin film transistor (TFT), the TFT comprising:
    a foldable substrate;
    a source electrode and a drain electrode separated from each other on the foldable substrate;
    a channel layer consisting of a group of discontinuous organic semiconductor nanofibers connecting the source electrode and the drain electrode;
    a gate electrode electronically insulated with the source electrode, the drain electrode, and the channel layer; and
    a gate insulating layer disposed between the channel layer and the gate electrode, and comprising an ionic liquid and a resin.

2. The foldable TFT of claim 1, wherein the foldable substrate is a paper substrate.

3. The foldable TFT of claim 2, wherein the paper substrate comprises a capping layer on a surface thereof.

4. The foldable TFT of claim 3, wherein the capping layer comprises a polymer film.

5. The foldable TFT of claim 1, wherein the foldable substrate comprises a plastic substrate.

6. The foldable TFT of claim 5, wherein the plastic substrate comprises a prepreg film interposed between plastic films.

7. The foldable TFT of claim 5, wherein the plastic substrate comprises polyimide (PI) interposed between plastic films.

8. The foldable TFT of claim 6, wherein the plastic film comprises at least one of polyphenylene oxide (PPO), polyethylene terephthalate (PETE), polybutylene terephthalate (PBT), polydihydroxymethylcyclohexyl terephthalate, cellulose esters, polycarbonate (PC), and polyamide (PA).

9. The foldable TFT of claim 7, wherein the plastic film comprises at least one of polyphenylene oxide (PPO), polyethylene terephthalate (PETE), polybutylene terephthalate (PBT), polydihydroxymethylcyclohexyl terephthalate, cellulose esters, polycarbonate (PC), and polyamide (PA).

10. The foldable TFT of claim 8, further comprising a polytetrafluoroethylene (PTFE) film on the plastic film.

11. The foldable TFT of claim 5, wherein the plastic substrate comprises a capping layer on a surface thereof.

12. The foldable TFT of claim 11, wherein the capping layer comprises at least one of $SiO_2$, SiON, SiN, FSG, HSQ, MSQ, BCB, PAE, and HOSP.

13. The foldable TFT of claim 1, wherein a material of the organic semiconductor of the channel layer comprises at least one of polythiophene, polyacetylene, polypyrrole, polyphenylene, polythienyl vinylidene, polyphenylene sulfide, polyaniline, polyparaphenylene vinylene, polyparaphenylene, polyfluorene, and polythiovinylene.

14. The foldable TFT of claim 1, wherein the nanofibers of the channel layer are web-shaped multiple nanofibers or wave-shaped multiple nanofibers.

15. The foldable TFT of claim 1, wherein a cation of the ionic liquid is one or more selected from the group consisting of a substituted or unsubstituted imidazolium, pyrazolium, triazolium, thiazolium, oxazolium, pyridazinium, pyrimidinium, pyrazinium, ammonium, phosphonium, guanidinium, euronium, thioeuronium, pyridinium, and pyrrollium.

16. The foldable TFT of claim 1, wherein an anion of the ionic liquid is one or more selected from the group consisting of halide anion, borate anion, phosphate anion, phosphinate anion, imide anion, sulfonate anion, acetated anion, sulfate anion, cyanate anion, thiocyanate anion, carbonate anion, and complex anion.

17. The foldable TFT of claim 1, wherein the ionic liquid comprises at least one of 1,3-dimethylimidazolium trifluoromethane sulfonate, 1-butyl-3-methylimidazolium bromide, 1-butyl-3-methylimidazolium chloride, 1-butyl-3-methylimidazolium hexafluorophosphate, 1-butyl-3-methylimidazolium hexafluorophosphate, 1-butyl -3-methylimidazolium iodide, 1-butyl-3-methylimidazolium methylsulfate, 1-butyl -3-methylimidazolium octylsulfate, 1-butyl-3-methylimidazolium tetrafluoroborate, 1-butyl-3-methylimidazolium trifluorometal sulfonate, 1-butyl-3-methylimidazolium trifluoroacetate, 1-ethyl-3-methylimidazolium bis[oxalato]borate, 1-ethyl-3-methylimidazolium bromide, 1-ethyl-3-methylimidazolium chloride, 1-ethyl-3-methylimidazolium hexafluorophosphate, 1-ethyl-3-methylimidazolium methylsulfate, 1-ethyl-3-methylimidazolium p-toluenesulfonate, 1-ethyl-3-methylimidazolium tetrafluoroborate, 1-ethyl-3-methylimidazolium thiocyanate, 1-ethyl-3-methylimidazolium trifluoromethane sulfonate, 1-ethyl-3-methylimidazolium trifluoroacetate, 1-ethyl-3-methylimidazolium bis(pentafluoroethyl)phosphinate, 1-hexadecyl-3-methylimidazolium chloride, 1-hexyl-3-methylimidazolium bis(trifluoromethylsulfonyl)imide, 1-hexyl-3-methylimidazolium chloride, 1-hexyl-3-methylimidazolium hexafluorophosphate, 1-hexyl-3-methylimidazolium tetrafluoroborate, 1-hexyl-3-methylimidazolium tri(pentafluoroethyl)trifluorophosphate, 3-methyl-1-octadecylimidazolium bis(trifluorosulfonyl)imide, 3-methyl-1-octadecylimidazolium hexafluorophosphate, 3-methyl-1-octadecylimidazolium tri(pentafluoroethyl)trifluorophosphate, 3-methyl-1-octylimidazolium bis(trifluoromethylsulfonyl)imide, 3-methyl-1-octylimidazolium chloride, 3-methyl-1-octylimidazolium hexafluorophosphate, 3-methyl-1-octylimidazolium octylsulfate, 3-methyl-1-octylimidazolium tetrafluoroborate, 3-methyl-1-tetradecylimidazolium tetrafluoroborate, 1-propyl-3-methylimidazolium iodide; 1-butyl-2,3-dimethylimidazolium chloride, 1-butyl-2,3-dimethylimidazolium hexafluorophosphate, 1-butyl-2,3-dimethylimidazolium iodide, 1-butyl -2,3-dimethylimidazolium octylsulfate,1-butyl-2,3-dimethylimidazolium tetrafluoroborate, 1-ethyl-2,3-dimethylimidazolium bromide, 1-ethyl-2,3-dimethylimidazolium chloride, 1-ethyl-2,3-dimethylimidazolium hexafluorophosphate, 1-ethyl-2,3-dimethylimidazolium p-toluenesulfonate, 1-ethyl-2,3-dimethylimidazolium tetrafluoroborate, 1-hexadecyl-2,3-dimethylimidazolium chloride, 1-hexyl-2,3-dimethylimidazolium chloride, 1,2,3-trimethylimidazolium iodide; N-hexylpyridinium bis(trifluoromethylsulfonyl)imide, N-butyl-3,4-dimethylpyridinium chloride, N-butyl-3,5-dimethylpyridinium chloride, N-butyl-3-methylpyridinium chloride, N-butyl-4-methylpyridinium bromide, N-butyl-4-methylpyridinium chloride, N-butyl-4-methylpyridinium hexafluorophosphate, N-butyl-4-methylpyridinium tetrafluoroborate, N-butylpyridinium chloride, N-butylpyridinium hexafluorophosphate, N -butylpyridinium trifluoromethane sulfonate, N-ethylpyridinium bromide, N-ethylpyridinium chloride, N-hexylpyridinium hexafluorophosphate, N-hexylpyridinium tetrafluoroborate, N -hexylpyridinium trifluorometal sulfonate, N-octylpyridinium chloride; 1,1-dimethylpyrroldinium iodide, 1-butyl-1-methylpyrroldinium bis(trifluoromethylsulfonyl)imide, 1-butyl-1-methylpyrroldinium chloride, 1-butyl-1-methylpyrroldinium hexafluorophosphate, 1-butyl-1-methylpyrroldinium tetrafluoroborate, 1-butyl-1-methylpyrroldinium trifluoroacetate, 1-butyl-1-methylpyrroldinium trifluorometal sulfonate, 1-butyl-1-methylpyrroldinium tri(pentafluoroethyl)trifluorophosphate, 1-butyl-1-methylpyrroldinium bis[oxalato(2-)]borate, 1-hexyl-1-methylpyrroldinium chloride, 1-methyl-1-octylpyrroldinium chloride; trihexyl(tetradecyl)phosphonium bis(trifluoromethylsulfonyl)imide, trihexyl(tetradecyl)phosphonium bis[oxalato(2-)]borate, trihexyl(tetradecyl)phosphonium chloride, trihexyl(tetradecyl)phosphonium hexafluorophosphate, trihexyl(tetradecyl)phosphonium tetrafluoroborate, trihexyl(tetradecyl)phosphonium tri(pentafluoroethyl)trifluorophosphate, 1-hexyl-3-methylimidazoliumtris(pentafluoride ethyl)trifluorophosphate, 1-butyl-3-methylimidazoliumtris(pentafluoride ethyl)trifluorophosphate, 1-butyl-3-methylimidazoliumhexafluorophosphate; methyltrioctylammonium bis(trifluoromethylsulfonyl)imide, methyltrioctylammonium trifluoroacetate, methyltrioctylammonium trifluorometal sulfonate, ethyl-dimethyl -propylammonium bis(trifluoromethylsulfonyl)imide; guanidinium trifluorometal sulfonate, guanidinium tri(pentafluoroethyl)trifluorophosphate, N"-ethyl-N,N,N',N'-tetramethylguanidinium trifluorometal sulfonate, N"-ethyl-N,N,N',N'-tetramethylguanidinium tri(pentafluoroethyl)trifluorophosphate; O-ethyl-N,N,N',N'-tetramethylisouronium trifluorometal sulfonate, O-ethyl-N,N,N',N'-tetramethylisouronium tri(pentafluoroethyl)trifluorophosphate, S-ethyl-N,N,N',N'-tetramethylisothiouronium trifluorometal sulfonate, S-ethyl-N,N,N',N'-tetramethylisouronium, and tri(pentafluoroethyl)trifluorophosphate.

18. The foldable TFT of claim 1, wherein the resin comprises at least one of an acrylic material, an epoxy material, and an elastomer material.

19. The foldable TFT of claim 16, wherein the resin comprises at least one of poly(ethylene glycol) diacrylate, trimethylolpropane triacrylate, and dipentaerythritol Hexa acrylate.

20. The foldable TFT of claim 1, wherein the channel layer is disposed over the source electrode and the drain electrode, and the gate electrode is disposed over the channel layer.

21. The foldable TFT of claim 1, wherein the channel layer is disposed under the source electrode and the drain electrode, and the gate electrode is disposed under the channel layer and over the substrate.

* * * * *